United States Patent
Kaida et al.

(10) Patent No.: US 10,396,752 B2
(45) Date of Patent: Aug. 27, 2019

(54) MEMS DEVICE

(71) Applicant: Murata Manufacturing Co., Ltd., Nagaokakyo-shi, Kyoto-fu (JP)

(72) Inventors: Hiroaki Kaida, Nagaokakyo (JP); Eitaro Kameda, Nagaokakyo (JP); Keisuke Takeyama, Nagaokakyo (JP); Daisuke Nakamura, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 383 days.

(21) Appl. No.: 15/206,585

(22) Filed: Jul. 11, 2016

(65) Prior Publication Data

US 2016/0322954 A1 Nov. 3, 2016

Related U.S. Application Data

(63) Continuation of application No. PCT/JP2015/050990, filed on Jan. 15, 2015.

(30) Foreign Application Priority Data

Jan. 17, 2014 (JP) .................................. 2014-007088

(51) Int. Cl.
*H03H 9/02* (2006.01)
*B81B 3/00* (2006.01)
(Continued)

(52) U.S. Cl.
CPC ....... *H03H 9/02448* (2013.01); *B81B 3/0086* (2013.01); *H03H 9/2447* (2013.01); (Continued)

(58) Field of Classification Search
CPC ............ H03H 9/02448; H03H 9/2447; H03H 2009/155; B81B 3/0086; B81B 2201/0271; B81B 2203/0109
See application file for complete search history.

(56) References Cited

U.S. PATENT DOCUMENTS 6,271,619 B1 * 8/2001 Yamada .................. H03H 3/02
  310/324
6,586,861 B2 * 7/2003 Misu ....................... H03H 3/04
  310/324
(Continued)

FOREIGN PATENT DOCUMENTS

EP  2530836 A1  12/2012
JP  H08186467 A  7/1996
(Continued)

OTHER PUBLICATIONS

International Search Report issued for PCT/JP2015/050991, dated Apr. 7, 2015.
(Continued)

*Primary Examiner* — Bryan P Gordon
(74) *Attorney, Agent, or Firm* — Arent Fox LLP (57) ABSTRACT

A MEMS device that suppresses variations in a resistance value caused by contracting vibrations in a direction in which a holding portion extends. The MEMS device includes a frame, a rectangular plate that receives an input of a driving signal, and holding portions that anchor the rectangular plate to the frame. The frame and the rectangular plate are both rectangular in shape. The holding portions are provided extending toward the frame from central areas of the opposing sides of the rectangular plate, and anchor the rectangular plate to the frame. A resistive film is formed in a region that follows a straight line connecting the holding portions that anchor the rectangular plate to the frame and that corresponds to no more than half a maximum displacement from a vibration distribution.

20 Claims, 8 Drawing Sheets

(51) Int. Cl.
*H03H 9/24* (2006.01)
*H03H 9/15* (2006.01)

(52) U.S. Cl.
CPC ............ *B81B 2201/0271* (2013.01); *B81B 2203/0109* (2013.01); *B81B 2203/0154* (2013.01); *B81B 2203/058* (2013.01); *H03H 2009/02496* (2013.01); *H03H 2009/155* (2013.01); *H03H 2009/2421* (2013.01)

(56) References Cited

U.S. PATENT DOCUMENTS

| | | | |
|---|---|---|---|
| 7,019,604 B2 | 3/2006 | Gotoh et al. | |
| 7,102,467 B2* | 9/2006 | Lutz | H03H 3/0077 324/691 |
| 8,410,868 B2* | 4/2013 | Schoepf | H03H 9/02448 310/346 |
| 2004/0017269 A1 | 1/2004 | Gotoh et al. | |
| 2012/0274647 A1* | 11/2012 | Lan | H03H 3/0072 345/531 |
| 2012/0305542 A1 | 12/2012 | Donnay et al. | |
| 2013/0038405 A1 | 2/2013 | Taniguchi et al. | |
| 2013/0285676 A1 | 10/2013 | Rahafrooz et al. | |
| 2014/0078870 A1 | 3/2014 | Kobayashi et al. | |
| 2014/0192628 A1 | 7/2014 | Tamura et al. | |
| 2016/0052018 A1 | 2/2016 | Park et al. | |
| 2018/0019726 A1 | 1/2018 | Han et al. | |
| 2018/0138888 A1 | 5/2018 | Yoon et al. | |

FOREIGN PATENT DOCUMENTS

| | | |
|---|---|---|
| JP | 2004112757 A | 4/2004 |
| JP | 2005151353 A | 6/2005 |
| JP | 2009094560 A | 4/2009 |
| JP | 2011155363 A | 8/2011 |
| JP | 2012065293 A | 3/2012 |
| JP | 4930381 B2 | 5/2012 |
| JP | 2012257246 A | 12/2012 |
| WO | WO 2007088696 A1 | 8/2007 |
| WO | WO 2008084578 A1 | 7/2008 |

OTHER PUBLICATIONS

Written Opinion of the International Searching Authority issued for PCT/JP2015/050991, dated Apr. 7, 2015.
International Search Report issued for PCT/JP2015/050990, dated Mar. 3, 2015.
Written Opinion of the Internatioanl Searching Authority issued for PCT/JP2015/050990, dated Mar. 3, 2015.

\* cited by examiner

MEMS DEVICE

CROSS REFERENCE TO RELATED APPLICATIONS

The present application is a continuation of PCT/JP2015/050990 filed Jan. 15, 2015, which claims priority to Japanese Patent Application No. 2014-007088, filed Jan. 17, 2014, the entire contents of each of which are incorporated herein by reference.

FIELD OF THE INVENTION

The present disclosure relates to a MEMS device in which a rectangular plate is affixed to a frame by a holding portion.

BACKGROUND OF THE INVENTION

Oscillators employing MEMS (Micro Electro Mechanical Systems) technology, in which vibrating portions including a piezoelectric thin film are configured upon a silicon semiconductor layer, have been under development for some time. In oscillators, there is demand minimal variation in oscillation frequency even if an ambient temperature varies, and a technique such as that described hereinafter has been disclosed as an oscillator using a MEMS structure.

For example, an oscillator has been disclosed in which a heater constituted of a resistor and a temperature sensor are formed upon a Lamb wave-mode MEMS device in which a piezoelectric thin film is formed on a silicon substrate, and the oscillator is driven by electrodes formed above and below the piezoelectric thin film (see Patent Document 1, for example). This oscillator is held by an I-shaped holding portion having an overall rectangular plate shape with portions extending from the centers of two opposing sides thereof. The oscillator is used as a resonator that resonates at a frequency based on the rectangular plate shape in response to a voltage being applied to the piezoelectric thin film of the MEMS device. The temperature sensor, which is formed in the vicinity of a rectangular plate-shaped vibrating structure, measures the temperature of the vibrating structure itself, and the heater is controlled so as to maintain a constant temperature. This provides a highly-precise temperature-compensated oscillator with an oscillation frequency with minimal variation even when the ambient temperature varies.

An oscillator employing a contour vibration (breathing vibration) mode electrostatic MEMS device that includes two T-shaped holding portions extending from central areas on two opposing sides of a rectangular plate has been disclosed as another example (see Patent Document 2, for example). This document discloses a MEMS device in which two resistive films are formed integrally on a line that connects the holding portions. This MEMS device vibrates in a contour mode in response to an electrostatic force between an electrode formed on a vibrating body and an electrode formed on an anchoring portion. According to this oscillator, an oscillation frequency is adjusted, a heater is controlled to maintain a set temperature, and so on by using the resistive film to measure a temperature of a resonator and controlling a DC bias so as to correct skew between a frequency at that temperature and a reference frequency. This design provide a highly-precise temperature-compensated oscillator.

Patent Document 1: U.S. Pat. No. 8,410,868.
Patent Document 2: European Patent Application Publication No. 2,530,836.

Incidentally, with the oscillator according to Patent Document 1, in the Lamb wave mode, an amplitude of vibrations is high in peripheral portions of the rectangular plate and a thin-film resistance deforms by contracting in response to vibrations. Accordingly, variations in resistance caused by vibrations are superimposed as noise over variations in resistance caused by temperature, and a highly-accurate temperature measurement cannot be taken. As such, a highly-precise oscillator cannot be realized. Additionally, the deforming contractions are large, leading to issues in terms of reliability such as peeling or the like.

On the other hand, when an electrostatic force is applied to elicit expansions and contractions in a direction perpendicular to the direction of the straight line connecting the holding portions as in the oscillator according to Patent Document 2, there is a high degree of coupling in the straight line direction when the vibrating mode is the contour vibration mode. This produces small, but noticeable expansions and contractions in the straight line direction along the straight line that connects the holding portions as well (that is, the direction in which the holding portion extends). As such, according to this oscillator, a resistance value of the resistive film will vary in response to the expansions and contractions in the straight line direction, and a highly-accurate temperature measurement cannot be taken. Thus, highly-accurate temperature correction cannot be provided. Note that in Patent Document 2, the holding portions are formed having T shapes in order to reduce expansions and contractions along the straight line connecting the holding portions.

SUMMARY OF THE INVENTION

It is an object of the present disclosure to provide a MEMS device that suppresses variations in a resistance value caused by contracting vibrations in a direction in which a holding portion extends, and enables a highly-precise oscillator to be realized.

A MEMS device is disclosed that includes a substrate, a rectangular plate having short sides and long sides, that includes a piezoelectric layer and electrode films above and below the piezoelectric layer, and that receives an input of a driving signal from the exterior, and a pair of holding portions that anchor the rectangular plate. An insulating layer covers part of the electrode film and a resistive film is formed upon the insulating layer. The holding portions extend from a central area of the opposing short sides of the rectangular plate to a frame. The resistive film is formed in a region that follows a straight line that connects the holding portions and serves as a node of extension vibrations.

In an exemplary embodiment, the rectangular plate includes short sides and long sides, and has a lateral extension vibrating mode. Accordingly, an amplitude of vibrations is essentially parallel to the short side direction, and an amplitude in the long side direction can be reduced at the central areas of the short sides. The resistive film is formed upon the rectangular plate in a region that follows a straight line that connects the holding portions and serves as a node of the extension vibrations, and thus variation in a resistance value caused by vibrations is suppressed, making it possible to take a highly-accurate temperature measurement. As such, a highly-precise oscillator is provided according to the present disclosure.

DETAILED DESCRIPTION OF THE EMBODIMENTS

Hereinafter, an embodiment of the present disclosure will be described with reference to the drawings.

1. First Embodiment

Figure 1:
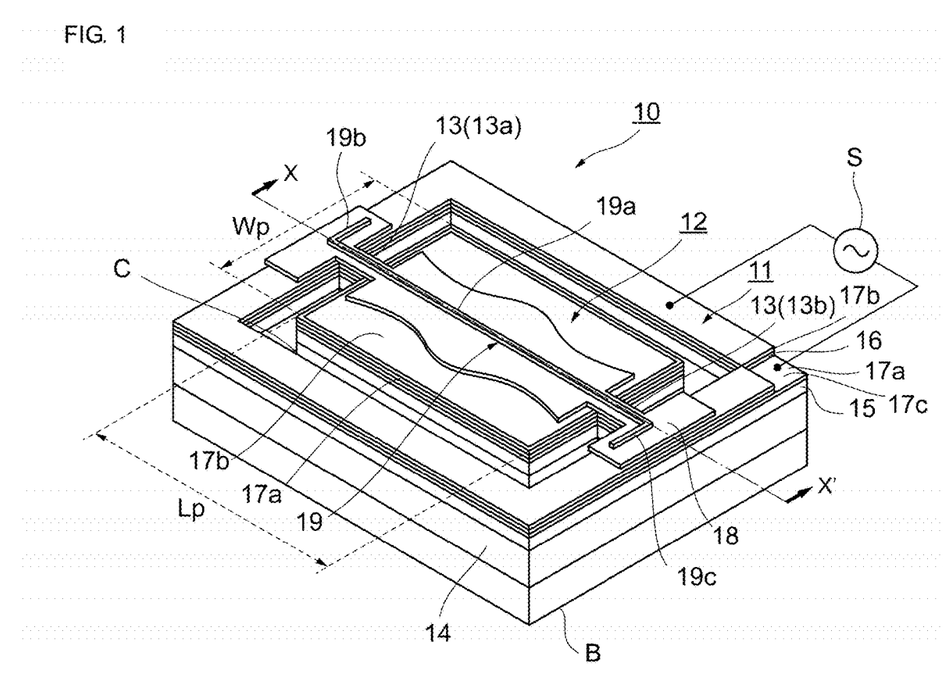
FIG. 1 is a perspective view illustrating the overall configuration of a MEMS device according to a first embodiment.
Figure 2:
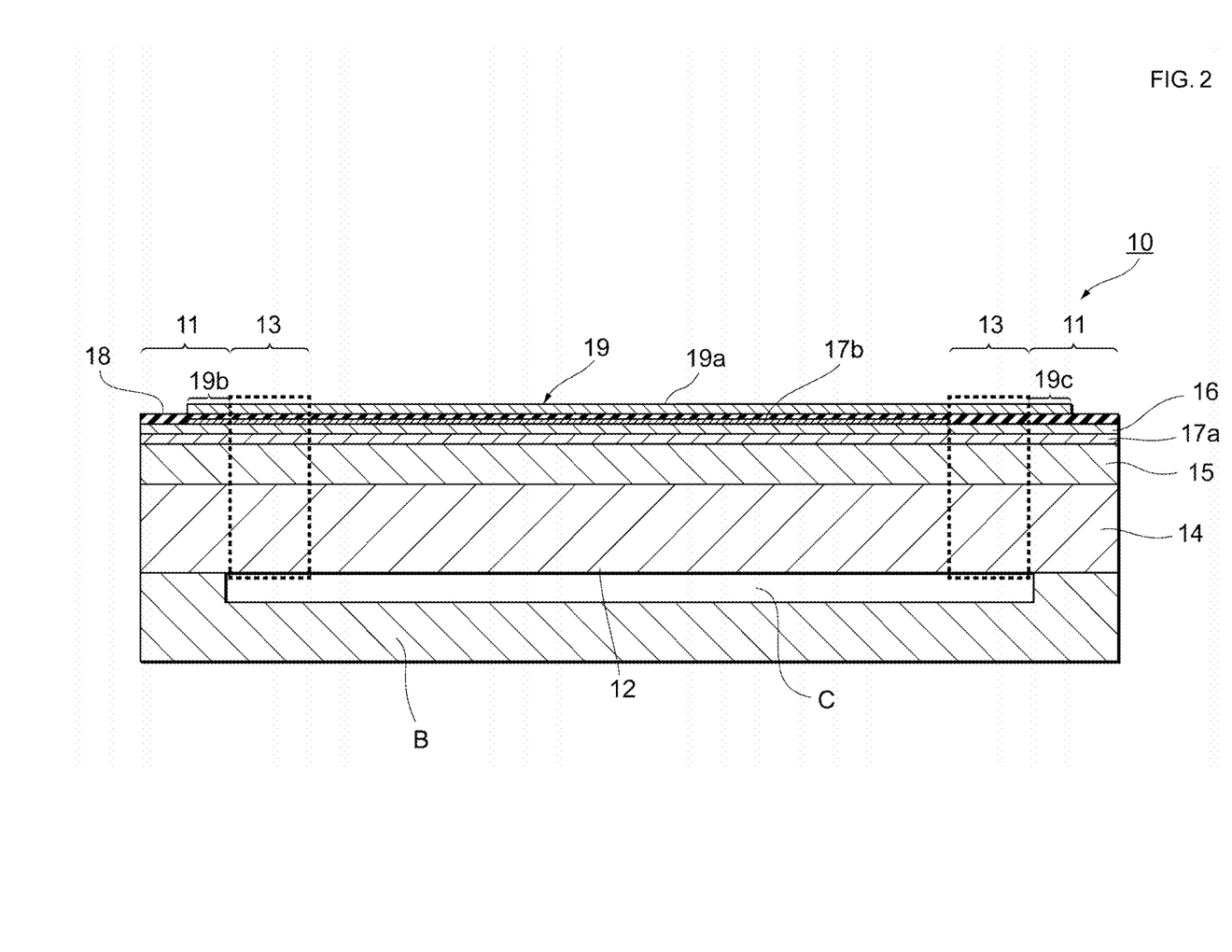
FIG. 2 is a cross-sectional view taken along an X-X' line indicated in FIG. 1.

FIG. 1 is a perspective view illustrating the overall configuration of a MEMS device 10 according to a first embodiment of the present disclosure, and FIG. 2 is a cross-sectional view taken along an X-X' line indicated in FIG. 1.

(Overall Configuration)

As illustrated in FIG. 1, the MEMS device 10 includes a frame 11, a rectangular plate 12 that receives an input of a driving signal from an external power source S, and holding portions 13 that anchor the rectangular plate 12 to the frame 11. These elements are provided upon a substrate B having a concave cavity C in a central area thereof. Accordingly, the rectangular plate 12 held by the frame 11 is capable of vibrating above the cavity C. Preferably, the frame 11 and the rectangular plate 12 are both rectangular in shape, having short sides and long sides. The holding portions 13 extend toward the frame 11 from central areas of the opposing short sides of the rectangular plate 12, and anchor the rectangular plate 12 to the frame 11. Although the short and long sides of the rectangular plate 12 and the short and long sides of the frame 11 are parallel in FIG. 1, these sides do not absolutely have to be parallel. In other words, the rectangular plate 12 can also be disposed so as to be slanted relative to the frame 11.

Here, the rectangular plate 12 includes short sides (Wp) and long sides (Lp), and has a lateral extension vibrating mode. Specifically, the rectangular plate 12 is formed so that a ratio between the long sides (Lp) and the short sides (Wp) (Lp/Wp) is 1.3 to 1.6, and preferably 1.46; for example, the long sides (Lp) are 0.22 mm and the short sides (Wp) are 0.15 mm. The holding portions are formed having a width of 2 μm and a length of 2 for example. It is noted that the frame 11, the rectangular plate 12, and the holding portions 13 are formed integrally from the same silicon wafer through a photolithography process according to one embodiment.

(Laminate Structure)

A laminated structure of the MEMS device 10 will be described in detail with reference to FIG. 2. The MEMS device 10 is formed by forming a silicon layer 14 upon the substrate B having the convex cavity C in a central area thereof, and then forming a silicon oxide film 15 through oxidation on the silicon layer 14. Additionally, a piezoelectric layer 16 is formed upon the silicon oxide film 15, with a lower excitation electrode 17a and an upper excitation electrode 17b disposed on the top and bottom, respectively, of the piezoelectric layer 16. An insulating layer 18 is formed upon the upper excitation electrode 17b, and a resistive film 19 is furthermore formed upon the insulating layer 18. Note that the silicon oxide film 15, the piezoelectric layer 16, and the upper and lower excitation electrodes 17a and 17b are formed on the silicon layer 14 across almost the entire surface of the rectangular plate 12. However, because part of the frame 11 (here, one corner part of the frame 11) receives the driving signal from the external power source S, an exposed portion 17c that exposes the lower excitation electrode 17a from the upper excitation electrode 17b and the piezoelectric layer 16 is provided. It is noted that the excitation electrodes 17a and 17b formed in the frame 11 are connected to excitation electrodes 17a and 17b formed in the rectangular plate 12 through the holding portions 13.

As shown, the resistive film 19 has a straight portion 19a that traverses on the holding portions 13 from a part of the rectangular plate 12, and extended portions 19b and 19c that are extended above the frame 11. When a current flows in the resistive film 19 from the exterior, a voltage based on a resistance value thereof is produced, and a temperature is measured from that voltage value. The insulating layer 18 is formed on parts of the frame 11 and the rectangular plate 12 in accordance with arrangement of the resistive film 19. The arrangements of the insulating layer 18 and the resistive film 19 will be described in detail later.

(Laminate Materials)

The silicon layer 14 is formed at a thickness of 10 μm and the silicon oxide film 15 is formed at 0.48 μm, for example. Forming silicon oxide ($SiO_2$) makes it possible to suppress the amount by which the resonant frequency of the MEMS device varies in response to temperature. Doping the silicon layer 14 can also effectively suppress the amount by which the resonant frequency of the MEMS device varies in response to temperature. Although the silicon oxide film 15 is formed on the surface of the silicon layer 14 facing the piezoelectric layer 16 in the example illustrated in FIG. 2, the silicon oxide film 15 may be formed on the surface of the silicon layer 14 facing the cavity C.

The piezoelectric layer 16 is formed from aluminum nitride (AlN), and is formed at a thickness of 0.8 μm, for example. The piezoelectric layer 16 and the upper and lower excitation electrodes 17a and 17b are formed using a deposition device such as a sputterer. The upper and lower excitation electrodes 17a and 17b employ molybdenum (Mo) electrodes, and are formed at a thickness of 0.1 μm, for example. It should be appreciated that the piezoelectric layer is not limited to aluminum nitride, and zinc oxide (ZnO), a ceramic material such as lead zirconate titanate (PZT) and potassium sodium niobate (KNN), or the like may be used as well. These materials can be used by carrying out a poling treatment for aligning the polarization directions within the piezoelectric layer as necessary.

The insulating layer 18 is patterned through a photolithography process. In the present embodiment, the insulating layer 18 is formed from aluminum nitride (AlN), and is formed at a thickness of 0.1 µm, for example. Forming the insulating layer 18 and the piezoelectric layer 16 of the same aluminum nitride reduces stress caused by temperature changes and the like, and thus achieves a highly-stable structure having little degradation with respect to repeated thermal stresses. In addition, the insulating layer 18 can also be formed from silicon oxide ($SiO_2$). Forming the insulating layer 18 from silicon oxide has an effect of suppressing the amount by which the resonant frequency of the MEMS device varies in response to temperature. In this case, the insulating layer 18 is formed at a thickness of 0.8 for example. Meanwhile, the resistive film 19 is formed from a molybdenum (Mo) film, and is formed at a thickness of 0.1 for example.

(Detailed Configuration)

Here, the MEMS device 10 according to the present embodiment has a characteristic in that the ratio between the long sides (Lp) and the short sides (Wp) of the rectangular plate 12 (Lp/Wp) is 1.3 to 1.6, and preferably 1.45 to 1.50.

In addition, the resistive film 19 is formed on a predetermined region of the rectangular plate 12, and as a result, the insulating layer 18 is formed on a part of the upper excitation electrode 17b formed on the rectangular plate 12. In other words, as illustrated in FIG. 1, the resistive film 19 is formed in a region that follows a straight line (e.g., a "node" region) connecting the holding portions 13 that anchor the rectangular plate 12 to the frame 11 and that corresponds to no more than half a maximum displacement from a vibration distribution. In other words, the node is a linear territory where a node point of the holding portions 13 are connected to each other. Preferably, the resistive film may be patterned through photolithography or the like.

In the present embodiment, the resistive film 19 is particularly formed extending from upon the frame 11 opposing one short side (on an X side) of the rectangular plate 12, traversing on a holding portion 13a, passing through the node, traversing on the other holding portion 13b, and onto an outer frame opposing the other short side (on an X' side). In other words, the resistive film 19 has the extended portions 19b and 19c that are bent, on the frame 11, by 90 degrees in mutually opposite directions relative to the straight portion 19a on the node, and is therefore formed having an overall substantially S shape.

(Simulation Results)

A reason for setting the ratio between the long sides (Lp) and the short sides (Wp) of the rectangular plate (Lp/Wp) to approximately 1.46 and a reason for forming the resistive film 19 in a region where the holding portions 13 that anchor the rectangular plate 12 to the frame 11 follow the node as described above will be described using results of simulations indicated in FIGS. 3 and 4.

Figure 3A:
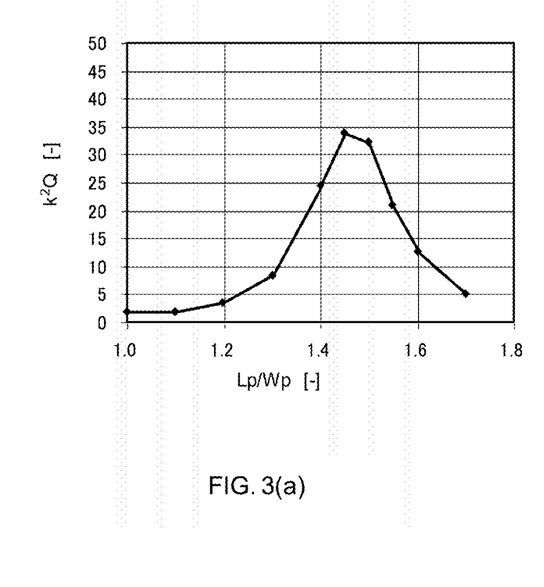
FIGS. 3(a) and 3(b) illustrate graphs indicating results of simulating ratios of long sides and short sides of a rectangular plate.
Figure 3B:
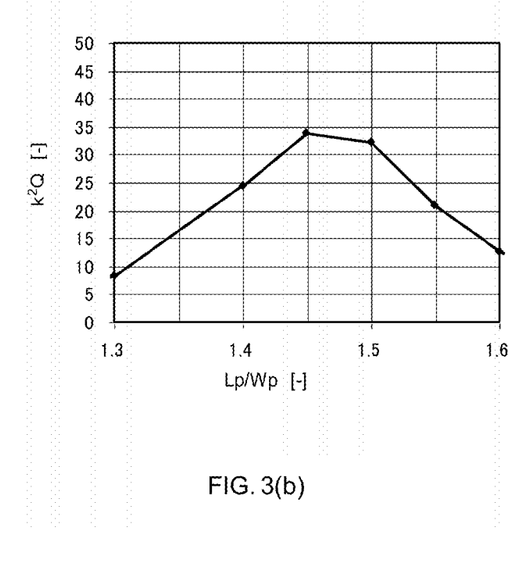

FIGS. 3(a) and (b) illustrate graphs indicating results of simulating oscillation characteristics ($k^2Q$) when causing the rectangular plate 12 to vibrate in a lateral extension vibrating mode in the case where the ratio between the long sides (Lp) and the short sides (Wp) of the rectangular plate 12 (Lp/Wp) is varied from 1.0 to 1.8; 3(a) indicates the overall results of the simulations, whereas 3(b) is a graph illustrating an enlargement of an area where the oscillation characteristics ($k^2Q$) are at a peak.

It is noted that these simulations were carried out for a case where respective end portions of the holding portions 13 were anchored to anchoring portions F and the device was caused to vibrate in the lateral extension vibrating mode, as indicated in FIG. 3(a). Although mentioned already, the following conditions were used for the MEMS device 10 in the simulations:

short sides (Wp): 0.15 mm (the long sides (Lp) were varied using the short sides as a reference value);
thickness of silicon layer 14: 10 µm;
thickness of silicon oxide film 15: 0.48 µm;
thickness of piezoelectric layer 16: 0.8 µm;
thicknesses of upper and lower excitation electrodes 17a and 17b: 0.1 µm;
thickness of insulating layer 18: 0.1 µm; and
thickness of resistive film 19: 0.1 µm.

As illustrated in FIGS. 3(a) and (b), the oscillation characteristics indicate favorable results in the case where the ratio between the long sides (Lp) and the short sides (Wp) (Lp/Wp) is 1.3 to 1.6, and preferably 1.45 to 1.50.

Figure 4A:
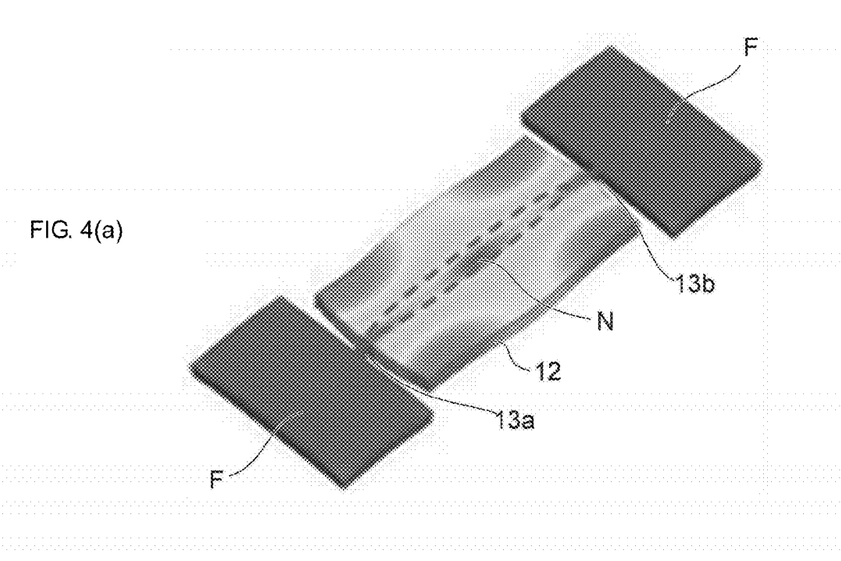
FIGS. 4(a) and 4(b) illustrate a conceptual diagram and a plan view illustrating a case where a rectangular plate is caused to vibrate in a lateral extension vibrating mode.
Figure 4B:
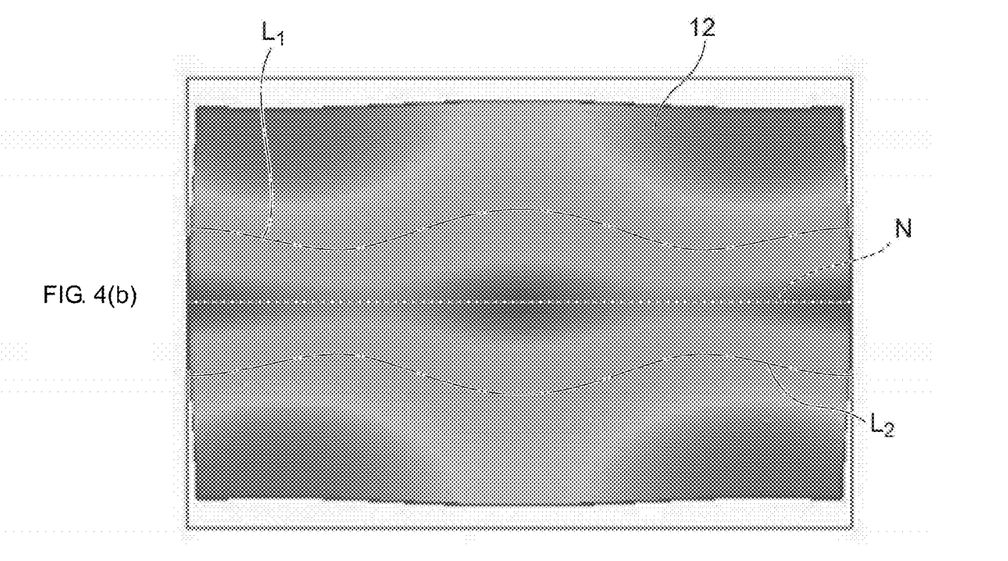

FIGS. 4(a) and (b) illustrates a vibration displacement distribution of the rectangular plate 12 at this time. FIG. 4(a) indicates a conceptual perspective view and FIG. 4(b) indicates a plan view with the rectangular plate 12 portion removed in the case where the ratio between the long sides (Lp) and the short sides (Wp) of the rectangular plate 12 (Lp/Wp) is approximately 1.46, respective ends of the holding portions 13 are anchored by the anchoring portions F, and the device is caused to vibrate in the lateral extension vibrating mode.

In these drawings, an amplitude displacement is indicated by a change in color from blue (low amplitude) to red (high amplitude), which has been replaced with grayscale here. Due to the grayscale representation of the displacement, the displacement is not necessarily clear, but the darker colors appearing at the anchoring portions F and the node N are blue, indicating low amplitude, and have been replaced with dark gray in these drawings. Meanwhile, moving away from the node N, the gradual transition from dark gray to light gray in the drawings is realized by replacing the original gentle color transition from green to yellow, and indicates that the amplitude increases as the gray color lightens. Furthermore, moving toward the four corners of the rectangular plate 12, the transition from light gray to dark gray in the drawings is realized by replacing the original color transition from yellow to dark red, and indicates that the amplitude increases further as the gray color darkens.

As is clear from FIG. 4(a), the amplitude is low in a region following the node N in central areas of the short sides. In FIG. 4(b), a region of no more than half the maximum displacement from the vibration distribution is indicated by dot-dash lines L1 and L2. It can be seen that the resistive film 19 is preferably disposed in a region within the range indicated by the dot-dash line, including the node.

(Other Example of Arrangement of Resistive Film)

It can thus be seen that, as described above, in the MEMS device 10 according to the present embodiment, the resistive film may be formed in a region that follows the node N, which is a straight line connecting the holding portions 13 that anchor the rectangular plate 12 to the frame 11, and that corresponds to no more than half a maximum displacement from the vibration distribution of the rectangular plate 12.

Figure 5:
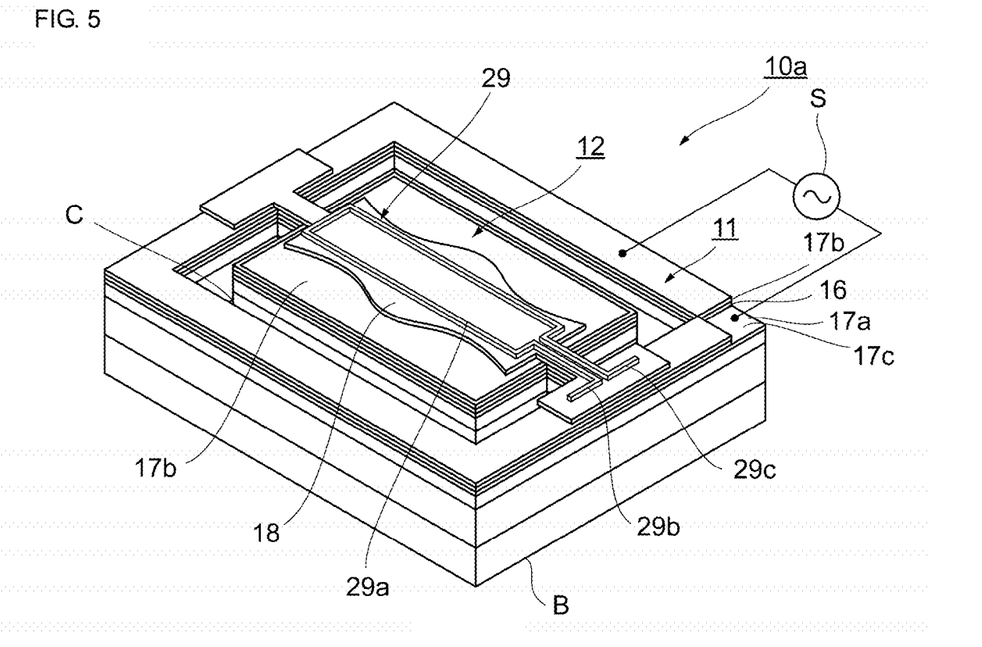
FIG. 5 is a perspective view illustrating another example of the arrangement of a resistive film in the MEMS device according to the first embodiment.
Figure 6:
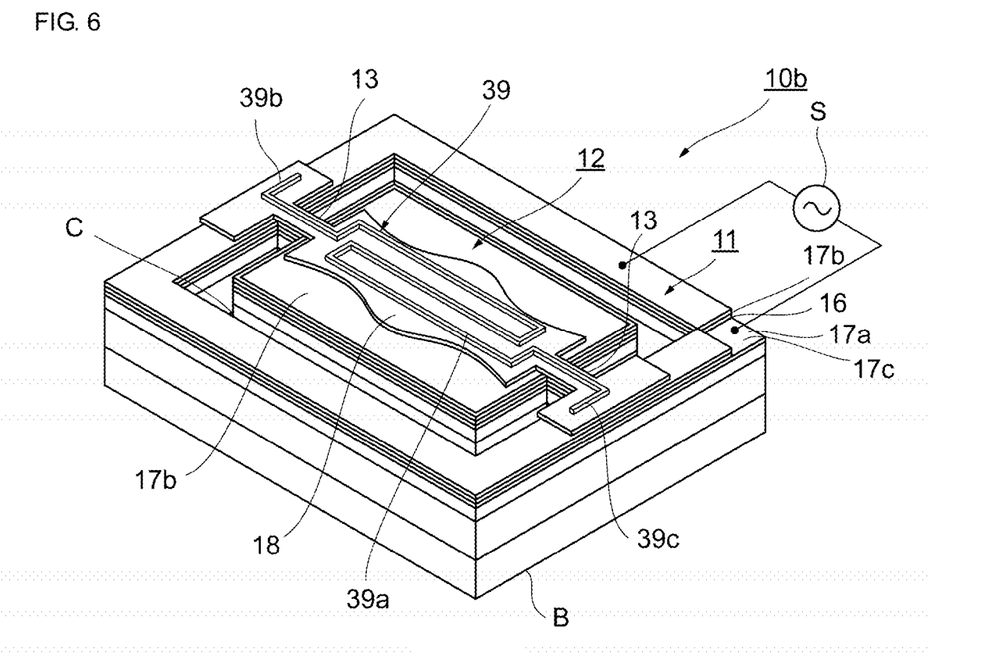
FIG. 6 is a perspective view illustrating another example of the arrangement of the resistive film in the MEMS device according to the first embodiment.

Another example of the arrangement of the resistive film in the MEMS device 10 is illustrated in FIGS. 5 and 6. FIG. 5 is a diagram illustrating an example in which a resistive film 29 is disposed upon the insulating layer 18. In this drawing, the resistive film 29 has extended portions 29b and 29c formed on the frame 11 on one short side end of the rectangular plate 12, and a main body 29a formed in a bent-back shape that makes a pass around the periphery of the insulating layer 18.

FIG. 6 is a diagram illustrating an example in which a resistive film 39 is disposed upon the insulating layer 18. In this drawing, the resistive film 39 has extended portions 39b and 39c formed on the frame 11 on both short side ends of the rectangular plate 12, facing 90 degrees in different directions from a straight line connecting the holding portions 13, and a main body 39a formed upon the insulating layer 18 in a substantially N shape so as to connect the extended portions 39b and 39c.

In these examples, the resistive film can be formed in a region that follows the node and that is no more than half the maximum displacement from the vibration distribution, and a path of resistance of the resistive film can also be lengthened.

(Actions and Effects)

According to the MEMS device 10 of the present embodiment as described above, the rectangular plate 12 includes short sides (Wp) and long sides (Lp), and has a lateral extension vibrating mode. Accordingly, an amplitude of vibrations is essentially parallel to the short side direction, and an amplitude in the long side direction can be reduced at the central areas of the short sides.

Here, with contour vibrations, coupling the vibrations in the short sides and the long sides makes it possible to achieve vibrations having a high vibration amplitude. However, when the resistive film is formed upon the vibrating body, the resistive film will also experience greater expansion and contraction in response to the vibrations. When the resistive film expands and contracts, the resistance value thereof varies, and thus a high temperature measurement accuracy cannot be achieved. The effects of this are particularly marked in a film in which the temperature characteristics are linear and highly accurate but that has a low resistance change rate in response to temperature, such as a Pt film or the like.

Accordingly, lateral extension vibrations are preferable in a highly-precise oscillator in which a temperature sensor is integrated with a vibrating body. Additionally, because the amplitude at the central areas of the rectangular plate 12 is low, vibrations in the frame 11 caused by vibration leakage can be suppressed even when the holding portions 13 are configured so as to be short. The resonator 10 as a whole can thus be made smaller.

In this manner, according to the MEMS device 10 of the present embodiment, a region of low displacement can be secured around the central areas of the short sides of the rectangular plate 12, and forming the resistive film in that range makes it possible to achieve an oscillator having low resistance variations caused by vibrations and a favorable temperature measurement accuracy. Additionally, according to the MEMS device 10, there is little displacement caused by vibrations, and thus little stress is produced by vibrations, making it possible to suppress the insulating layer 18 from separating from the layers therebelow.

In particular, the MEMS device 10 of the present embodiment assumes a base wave resonator in a lateral extension mode, having a rectangular shape in which the ratio between the long sides (Lp) and the short sides (Wp) (Lp/Wp) is 1.3 to 1.6 and preferably 1.45 to 1.50. This makes it possible to almost completely eliminate contracting displacement at the central areas of the short sides of the rectangular plate 12. Furthermore, a region of low displacement can be secured in a wide range around the node N in the center of the rectangular plate 12. Accordingly, forming the resistive film 19 in a region corresponding to no more than half the maximum displacement from the vibration distribution of the rectangular plate 12 suppresses variations in the resistance of the resistive film 19 caused by vibrations, which makes it possible to take a highly-accurate temperature measurement in the MEMS device 10.

Meanwhile, when the resistive film is thin, the characteristics thereof are unstable, and thus it is necessary for the resistive film to be greater than or equal to a certain thickness. This tends to reduce the resistance value thereof. A reduced resistance results in an increased amount of current during temperature measurement and a resulting increase in heat produced by the current. In response to this, the arrangement of the resistive film 29 or the resistive film 39 illustrated in FIG. 5 or FIG. 6 makes it possible to lengthen the resistance path and increase the resistance value. The resistive film can be arranged in this manner because in the MEMS device 10 of the present embodiment, the lateral extension mode is employed, which makes it possible to secure a region of low displacement across a wide range, and variation in the resistance caused by contractions can therefore be suppressed even if the resistive film is formed across a wide range.

Additionally, according to the MEMS device 10 of the present embodiment, an example in which AlN is used as the insulating layer 18 is given as a basic example, and forming the layer of $SiO_2$ through thermal oxidization thereof is also described as being possible. When using a film whose Poisson ratio is lower than silicon, such as $SiO_2$, as a film in order to suppress the amount by which the resonant frequency of the MEMS device varies in response to temperature, the overall Poisson ratio will drop as well. The lateral extension vibration, which has low displacement in the center areas of the short sides, is used. This thus generally leads to an increase in the ratio between the long sides and the short sides, increasing the long side dimension relative to the same frequency, or in other words, the same width dimension, and leads to an increase in the size of the resonator 10. However, according to the present embodiment, the thickness of the silicon layer 14 is greater than or equal to 80% of the overall thickness of the MEMS device, and thus even in this configuration, a small-sized resonator having small vibrations in the long side direction at the central areas of the short sides can be achieved without increasing the ratio between the long sides and the short sides. It is noted that the overall thickness referred to here is a thickness from a bottom surface of the silicon layer 14 to a top surface of the uppermost layer of thin film laminated upon the rectangular plate 12 (the top surface of the resistive film 19, in the present embodiment).

2. Second Embodiment

In a second embodiment, a MEMS device 20 is formed by improving part of a process for manufacturing the MEMS device 10 according to the first embodiment. The following will only describe differences from the first embodiment. Elements that are the same as those in the first embodiment will be given the same reference numerals, and descriptions thereof will be omitted, excepting cases of particular differences.

Figure 7:
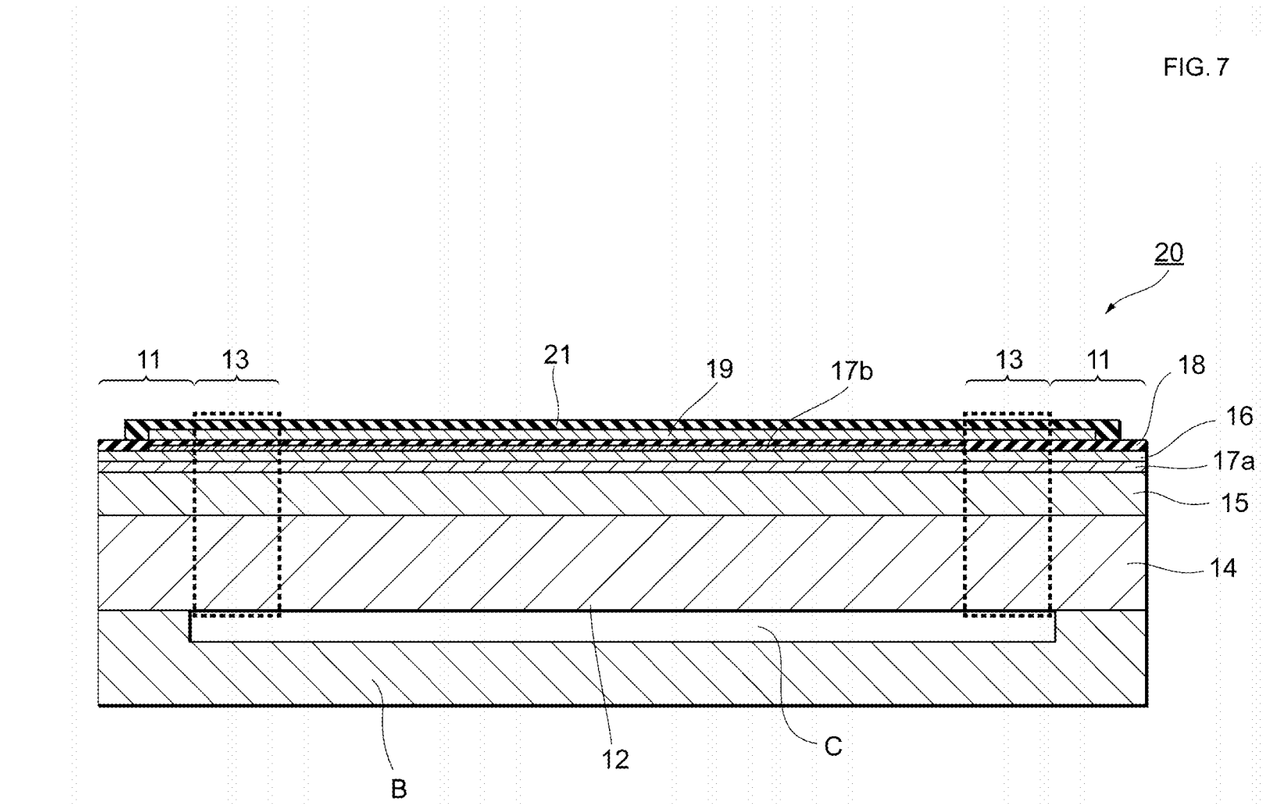
FIG. 7 is a cross-sectional view illustrating the configuration of a MEMS device according to a second embodiment.

FIG. 7 is a cross-sectional view illustrating the MEMS device 20 according to the second embodiment. Note that the basic configuration of the MEMS device 20 is the same as in the example illustrated in FIG. 1, and this drawing is a cross-section taken along the X-X' line indicated in FIG. 1.

Like the first embodiment, in the MEMS device 20, a high-density Mo electrode is formed upon the piezoelectric layer 16 as the upper excitation electrode 17b so as to cover almost the entire surface of the rectangular plate 12, and the insulating layer 18, formed from AlN having a lower density than the Mo, is furthermore formed as a layer thereabove. The insulating layer 18 is then partially removed through photolithography, exposing the upper excitation electrode 17b in a region where the displacement of the rectangular plate 12 is greater than or equal to 50% of the maximum displacement, as described in the first embodiment.

In the present embodiment, after the above-described processes, the resistive film 19 is first formed on the insulating layer 18. As in the first example, the resistive film 19 has the straight portion 19a that passes above the holding portions 13 from a part of the rectangular plate 12, and the extended portions 19b and 19c that are extended above the frame 11. A second insulating layer 21 is furthermore formed so as to cover the resistive film 19. It is desirable that the density of the second insulating layer 21 be as low as possible. Then, the second insulating layer 21 is also partially removed through photolithography, exposing the upper excitation electrode 17b in a region where the displacement of the rectangular plate 12 is greater than or equal to 50% of the maximum displacement. The driving signal is applied to the upper excitation electrode 17b and the lower excitation electrode 17a in this state, and the resonant frequency of the device is measured. Then, the MEMS device 20, which has a low level of frequency variation, is obtained by adjusting an amount of the exposed upper excitation electrode 17b to be partially removed or a degree to which the thickness of the exposed upper excitation electrode 17b is to be reduced by an ion beam, in accordance with a difference from a target resonant frequency.

Next, an effect of partially removing or thinning the exposed upper excitation electrode 17b will be described. With a resonator that uses a lateral extension vibrating mode as in the present embodiment, removing or thinning an electrode or the like increases a frequency in an outer peripheral region in which there is greater displacement of the rectangular plate 12, whereas the frequency decreases in a central area including the node. This is illustrated in FIG. 8.

Figure 8:
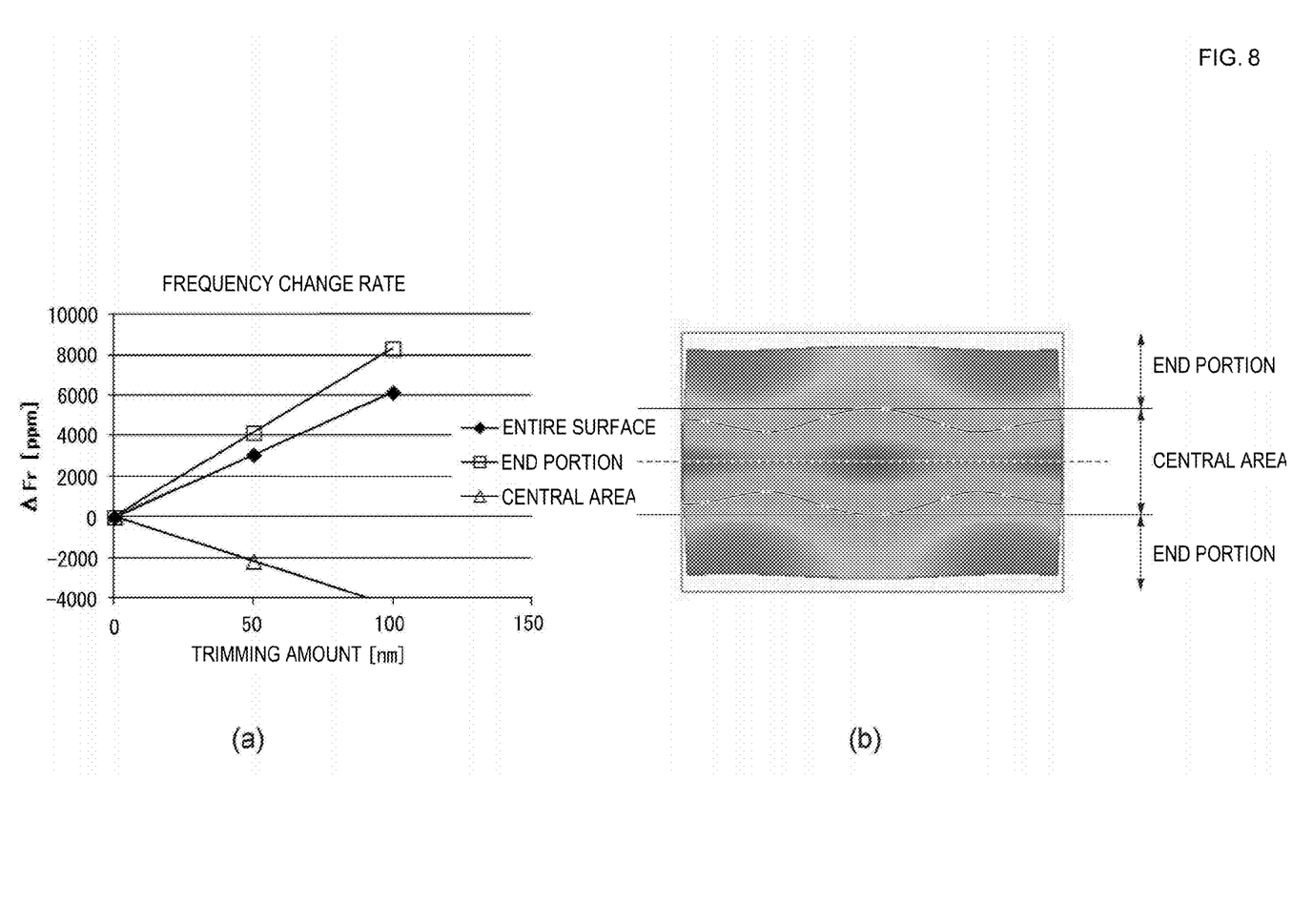
FIG. 8 is a graph (a) and a conceptual diagram (b) illustrating frequency variations in the case where an exposed electrode has been removed from the MEMS device according to the second embodiment.

In particular, FIG. 8 illustrates a graph (a) in which the horizontal axis represents the thickness of the exposed upper excitation electrode 17b that has been thinned (a trimming amount) by adjusting the regions in which the insulating layer 18 and the second insulating layer 21 are formed and irradiating the upper excitation electrode 17b exposed in the rectangular plate 12 of the MEMS device 20 across the entire surface thereof, both end portions (see diagram (b) of FIG. 8) of the sides on which the long sides are located (see Lp in FIG. 1) thereof, and a central area including the node (see diagram (b) of FIG. 8) thereof using an ion beam, for example, and in which the vertical axis represents variation in the frequency in those cases. In the case where the rectangular plate 12 of the MEMS device 20 is viewed in plan view and divided into four equal regions in the node direction, the above-described both end portions are defined as the two regions located on both side ends, and the above-described central area is defined as the two regions located in positions on both sides of the node, as indicated in the diagram (b).

According to this drawing, a frequency rise of 63 ppm is seen every 1 nm of the trimming amount in the case where the entire surface of the rectangular plate 12 has been irradiated with the ion beam, whereas a frequency drop of 44 ppm is seen every 1 nm of the trimming amount in the case where the central area of the rectangular plate 12 including the node has been irradiated, as indicated in the reference example on the right side of the graph. On the other hand, in the case where both end portions located toward the long sides of the rectangular plate 12 have been irradiated, a frequency rise of 83 ppm is seen every 1 nm of the trimming amount.

In this manner, according to the MEMS device 20, it can be seen that thinning the upper excitation electrode 17b in a range where the displacement of the rectangular plate 12 is greater than or equal to 50% of the maximum displacement makes it possible to efficiently increase the resonant frequency of the resonator. In particular, the low-density insulating film is formed in the central area, and thus even if the entirety of the device is irradiated with ions, the effect in which the frequency drops due to the low-density film in the central area being removed can be reduced. Meanwhile, providing the second insulating layer 21 that protects the resistive film 19 when removing the exposed upper excitation electrode 17b makes it possible to protect the resistive film 19 when removing the upper excitation electrode 17b. Although a case where the thickness of the exposed upper excitation electrode 17b is reduced is described here, the same actions and effects can be achieved even when removing part of the exposed upper excitation electrode 17b.

Although the second insulating layer 21 is not formed in the region where the displacement of the rectangular plate 12 is greater than or equal to 50% of the maximum displacement in the present second embodiment, the second insulating layer 21 may be formed across almost the entire surface of the rectangular plate 12, and a high-density film such as an AlN film may furthermore be formed in the region, located thereabove, where the displacement of the rectangular plate 12 is greater than or equal to 50% of the maximum displacement. In this case, the structure is such that the central area has a low density and a high-density film is disposed in the periphery thereof, making it possible to efficiently increase the frequency. Furthermore, in this case, unevenness in the cross-section can be reduced, which also makes it possible to reduce vibration loss.

3. Other Embodiments

The present disclosure is not limited to the above-described embodiments, and also includes other embodiments such as those described hereinafter. Although the above embodiments describe an example in which a single rectangular plate 12 is held relative to the frame 11 with the holding portions 13 interposed therebetween, the present disclosure is not limited to such an example.

Figure 9A:
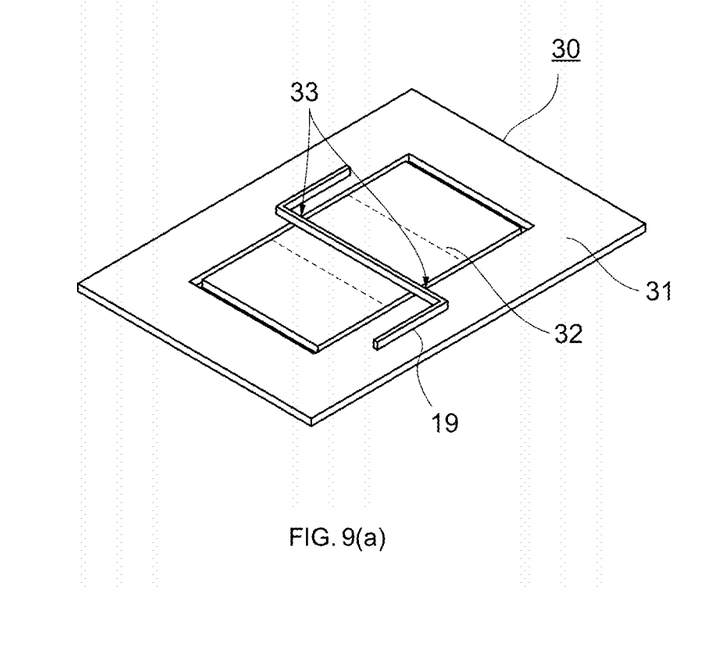
FIGS. 9(a) and (b) are perspective views illustrating the configuration of a MEMS device according to other embodiments.
Figure 9B:
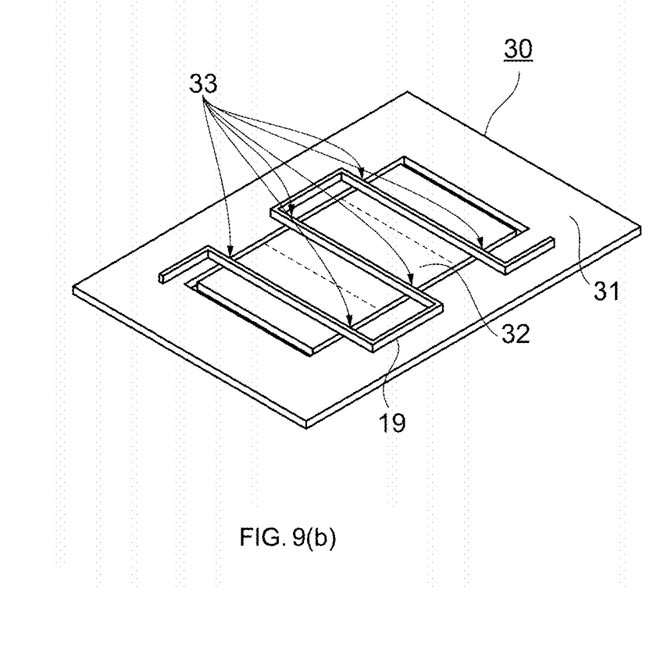

As illustrated in FIG. 9(a), a MEMS device 30 can be configured by connecting three of the rectangular plates 12 according to the above embodiments as a rectangular plate 32 relative to a frame 31, and the device can be driven by a third-order harmonic. In this case, as illustrated in FIG. 9(a), holding portions 33 extend from the central area, and the resistive film 19 can be formed so as to traverse on the holding portions 33, in the same manner as the example illustrated in FIG. 1. Meanwhile, as illustrated in FIG. 9(b), a total of six holding portions 33 can be provided for each of the connected three rectangular plates 12 according to the above embodiment connected as the rectangular plate 32, and the resistive film 19 can be formed so as to traverse on all of the six holding portions 33. In this case, it is preferable that the short side direction of the rectangular plate 32, which is a holding direction in which the holding portions 33 are provided, be 0.3 mm, and a long side direction orthogonal thereto be 0.4 mm, for example.

It is noted that the number of rectangular plates formed is not limited to three as in the example described above; n rectangular plates can also be connected and driven by nth-order harmonics (where n is an odd number such as 1, 3, 5, 7, and so on). In addition, in the examples illustrated in FIGS. 9(a) and (b), the resistive film 19 can of course be arranged in other patterns aside from the patterns illustrated in FIGS. 5 and 6.

REFERENCE SIGNS LIST 10, 20, 30 MEMS DEVICE
11, 31 FRAME
12, 32 RECTANGULAR PLATE
13, 13a, 13b HOLDING PORTION
14 SILICON LAYER
15 SILICON OXIDE FILM
16 PIEZOELECTRIC LAYER
17a, 17b UPPER AND LOWER EXCITATION ELECTRODES
17c EXPOSED PORTION
18, 21 INSULATING LAYER
19, 29, 39 RESISTIVE FILM
19a STRAIGHT PORTION
19b, 19c, 29b, 29c, 39b, 39c EXTENDED PORTION
29a, 39a MAIN BODY
B SUBSTRATE
C CAVITY
F ANCHORING PORTION
N NODE
S EXTERNAL POWER SOURCE

The invention claimed is:

1. A MEMS device comprising:
a substrate;
a frame disposed on the substrate;
a plate including a piezoelectric layer and a pair of electrode films disposed on opposing surfaces of the piezoelectric layer, respectively, with the pair of electrodes including an upper electrode and a lower electrode closer to the substrate than the upper electrode;
a pair of holding portions disposed on opposing sides of the plate and anchoring the plate to the frame;
an insulating layer disposed on the plate; and
a resistive film disposed on the insulating layer on a region of the insulating layer that extends along a straight line between the holding portions, such that the insulating layer electrically insulates the resistive film and at least one electrode film of the pair of electrode films,
wherein the insulating layer is disposed between the resistive film and the upper electrode of the pair of electrodes.

2. The MEMS device according to claim 1, wherein at least one node of lateral extension vibrations of the MEMS device is positioned in the region along the straight line between the holding portions.

3. The MEMS device according to claim 1,
wherein the plate comprises a rectangular shape with a pair of short sides and a pair of long sides, and
wherein the holding portions extend from a central area of the short sides, respectively, to the frame.

4. The MEMS device according to claim 3, further comprising a cavity disposed between outer edges of the plate and inner edges of the frame.

5. The MEMS device according to claim 3, wherein the long sides of the plate have a length that is between 1.3 and 1.6 times longer than a length of the short sides.

6. The MEMS device according to claim 1, wherein the resistive film is disposed over a region of the plate that experiences no more than half of a maximum displacement of a vibration distribution of the plate.

7. The MEMS device according to claim 1, wherein the resistive film is disposed on the insulating layer so that a resistance path starts and ends on one of the holding portions.

8. The MEMS device according to claim 1, wherein the substrate has a thickness greater than or equal to 80% of an overall thickness of the MEMS device.

9. The MEMS device according to claim 1, wherein the substrate comprises at least a silicon layer.

10. The MEMS device according to claim 9, wherein the substrate comprises a silicon oxide layer.

11. A MEMS device comprising:
a substrate;
a frame disposed on the substrate;
a plate including a piezoelectric layer and a pair of electrode films disposed on opposing surfaces of the piezoelectric layer, respectively;
a pair of holding portions disposed on opposing sides of the plate and anchoring the plate to the frame;
an insulating layer disposed on the plate; and
a resistive film disposed on the insulating layer on a region of the insulating layer that extends along a straight line between the holding portions,
wherein the resistive film comprises a resistance path with a pair of extended portions extending above the frame and adjacent to the holding portions, respectively.

12. The MEMS device according to claim 11, wherein the extended portions are bent over the frame by 90 degrees.

13. The MEMS device according to claim 12, wherein the extended portions are bent in mutually opposite directions relative to the straight line between the holding portions.

14. A MEMS device comprising:
a substrate;
a plate anchored above the substrate with a cavity disposed therebetween, the plate including a piezoelectric layer and a pair of electrode films disposed on opposing surfaces of the piezoelectric layer, respectively;
an insulating layer disposed on the plate; and
a resistive film disposed directly on the insulating layer and over a region of the plate that has no more than half of a maximum displacement of a vibration distribution when the plate vibrates,
wherein the insulating layer electrically insulates the resistive film and at least one electrode film of the pair of electrode films.

15. The MEMS device according to claim 14, further comprising:
a rectangular frame disposed on the substrate; and
a pair of holding portions disposed on opposing sides of the plate and configured to anchor the plate to the frame with the cavity disposed the plate and the substrate.

16. The MEMS device according to claim 15,
wherein the plate comprises a rectangular shape with a pair of short sides and a pair of long sides, and
wherein the holding portions extend from a central area of the short sides, respectively, to the frame.

17. The MEMS device according to claim 16, wherein the resistive film defines a resistance path that extends along a straight line between the holding portions.

18. The MEMS device according to claim 17, wherein the resistance path of the resistive film includes a pair of extended portions extending and bent over the frame by 90 degrees in mutually opposite directions relative to the straight line between the holding portions.

19. The MEMS device according to claim 16, wherein the long sides of the plate have a length that is between 1.3 and 1.6 times longer than a length of the short sides.

20. The MEMS device according to claim 14, wherein at least one node of lateral extension vibrations of the MEMS device is positioned in the region along the straight line between the holding portions.

* * * * *